(12) United States Patent
Kim

(10) Patent No.: US 9,443,581 B2
(45) Date of Patent: Sep. 13, 2016

(54) ELECTRONIC DEVICE AND METHOD FOR FABRICATING THE SAME

(71) Applicant: SK hynix Inc., Icheon-Si (KR)

(72) Inventor: Hyun-Jeong Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 252 days.

(21) Appl. No.: 14/213,424

(22) Filed: Mar. 14, 2014

(65) Prior Publication Data

US 2014/0293677 A1    Oct. 2, 2014

(30) Foreign Application Priority Data

Mar. 27, 2013   (KR) ........................ 10-2013-0032824

(51) Int. Cl.

| | | |
|---|---|---|
| G11C 11/40 | (2006.01) | |
| G11C 13/02 | (2006.01) | |
| G11C 13/00 | (2006.01) | |
| H01L 45/00 | (2006.01) | |
| H01L 27/22 | (2006.01) | |
| H01L 27/24 | (2006.01) | |

(52) U.S. Cl.
CPC ......... *G11C 13/0002* (2013.01); *G11C 13/003* (2013.01); *H01L 27/228* (2013.01); *H01L 27/2454* (2013.01); *H01L 45/04* (2013.01); *H01L 45/06* (2013.01); *H01L 45/1233* (2013.01); *H01L 45/141* (2013.01); *H01L 45/146* (2013.01); *H01L 45/147* (2013.01); *G11C 2213/74* (2013.01); *G11C 2213/79* (2013.01)

(58) Field of Classification Search
CPC .............. G11C 13/002; G11C 13/003; G11C 13/0002; G11C 13/003
USPC .......................................................... 365/148
See application file for complete search history.

(56) References Cited

U.S. PATENT DOCUMENTS

| | | | |
|---|---|---|---|
| 2014/0218999 A1* | 8/2014 | Sasago | H01L 27/2454 365/63 |
| 2015/0263068 A1* | 9/2015 | Ito | H01L 27/228 365/158 |

FOREIGN PATENT DOCUMENTS

| | | |
|---|---|---|
| KR | 10-2003-0070817 A | 9/2003 |
| KR | 10-2011-0136298 A | 12/2011 |

*Primary Examiner* — Huan Hoang
*Assistant Examiner* — Jay Radke
(74) *Attorney, Agent, or Firm* — Perkins Coie LLP

(57) ABSTRACT

An electronic device includes a semiconductor memory, the semiconductor memory including: a substrate configured to comprise a plurality of line patterns which are extended in a second direction, and a plurality of pillar patterns which protrude perpendicular to the line patterns and are arranged in the second direction and in a first direction crossing the second direction; a source line configured to be formed between the line patterns, to be coupled to the line patterns disposed at both sides of the source line, and to be extended in the second direction; a word line configured to be in contact with sidewalls of the pillar patterns arranged in the first direction, and to be extended in the first direction; an interconnection line configured to be disposed over the pillar patterns, and to be extended in the first direction so as to be coupled to the pillar patterns arranged in the first direction; variable resistance elements configured to be disposed over the interconnection line, and to be positioned between the pillar patterns which are adjacent to each other in the first direction; and a bit line configured to be disposed over the variable resistance elements, and to be extended in the second direction so as to be coupled to the variable resistance elements arranged in the second direction.

16 Claims, 17 Drawing Sheets

ELECTRONIC DEVICE AND METHOD FOR FABRICATING THE SAME

CROSS-REFERENCE TO RELATED APPLICATIONS

The present application claims priority of Korean Patent Application No. 10-2013-0032824, entitled "SEMICONDUCTOR DEVICE AND METHOD FOR MANUFACTURING THE SAME, AND MICRO PROCESSOR, PROCESSOR, SYSTEM, DATA STORAGE SYSTEM AND MEMORY SYSTEM INCLUDING THE SEMICONDUCTOR DEVICE," and filed on Mar. 27, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for the semiconductor devices have been conducted. Examples of such semiconductor devices include semiconductor devices which can store data using a characteristic that switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the degree of integration of a device may be increase, the switching characteristics may be improved, and the degree of difficulty of the process may be reduced, and a method for fabricating the same.

In one aspect, an electronic device is provided to include a semiconductor memory that includes: a substrate configured to comprise a plurality of line patterns which are extended in a second direction, and a plurality of pillar patterns which protrude perpendicular to the line patterns and are arranged in the second direction and in a first direction crossing the second direction; a source line configured to be formed between the line patterns, to be coupled to the line patterns disposed at both sides of the source line, and to be extended in the second direction; a word line configured to be in contact with sidewalls of the pillar patterns arranged in the first direction, and to be extended in the first direction; an interconnection line configured to be disposed over the pillar patterns, and to be extended in the first direction so as to be coupled to the pillar patterns arranged in the first direction; variable resistance elements configured to be disposed over the interconnection line, and to be positioned between the pillar patterns which are adjacent to each other in the first direction; and a bit line configured to be disposed over the variable resistance elements, and to be extended in the second direction so as to be coupled to the variable resistance elements arranged in the second direction.

In another aspect, an electronic device is provided to include a semiconductor memory which includes: a substrate extending along first and second directions and including a plurality of line patterns extending in the second direction, and a plurality of pillar patterns protruding from the substrate and arranged in a matrix along the first and second directions; a source line extending in the second direction and formed between the line patterns to be coupled to the line patterns; a word line extending in the first direction and in contact with sidewalls of the pillar patterns arranged in the first direction; an interconnection line formed over the pillar patterns and extending in the first direction so as to be coupled to the pillar patterns arranged in the first direction; variable resistance elements formed over the interconnection line and positioned between the pillar patterns which are adjacent to each other in the first direction; and a bit line formed over the variable resistance elements and extending in the second direction so as to be coupled to the variable resistance elements arranged in the second direction.

In some implementations, the semiconductor memory may further include: a first insulating layer pattern having openings to expose parts of both sidewalls of the line patterns, wherein the source line is coupled to the line patterns through the openings, In some implementations, the semiconductor memory may further include: a first insulating layer pattern including openings to expose parts of both sidewalls of the line patterns and the substrate positioned between the adjacent line patterns arranged in the first direction, wherein the source line is coupled to the line patterns through the openings.

In some implementations, a lower surface of the word line may be positioned over an upper surface of the source line, and an upper surface of the word line may be positioned below upper surfaces of the pillar patterns.

In some implementations, the variable resistance elements include a metal oxide, a phase change material, a ferroelectric material and a ferromagnetic material.

In some implementations, one of the pillar patterns and the word line in contact with the pillar pattern form one transistor, and each of the variable resistance elements may be driven by two transistors positioned at both sides of the variable resistance element and arranged adjacently in the first direction.

In another aspect, an electronic device is provided to include a semiconductor memory that includes: a plurality of pairs of a word line and an interconnection line extending in a first direction; a plurality of pairs of a source line and a bit line extending in a second direction crossing the first direction; transistors disposed in regions wherein the word lines, interconnection lines and the source lines intersect, each transistor have one terminal coupled to the source line, another terminal coupled to the interconnection line, and a gate coupled to the word line; and variable resistance elements disposed in regions in which the bit lines and corresponding interconnection lines intersect, each variable resistance element being configured to have one terminal coupled to a corresponding interconnection line and another terminal coupled to a corresponding bit line.

In another aspect, an electronic device is provided to include a semiconductor memory that includes: a plurality of pairs of a word line and an interconnection line extending in a first direction; a plurality of pairs of a source line and a bit line extending in a second direction crossing the first direction; transistors disposed in regions wherein the word lines, interconnection lines and the source lines intersect, each transistor having three terminals coupled to a corresponding source line, a corresponding interconnection line, and a corresponding word line, respectively; and variable resistance elements disposed in regions in which the bit lines and corresponding interconnection lines intersect, each variable resistance element being configured to have one terminal coupled to a corresponding interconnection line and another terminal coupled to a corresponding bit line.

In some implementations, each variable resistance element may be driven by two transistors positioned at both sides of the variable resistance element in the first direction. In some implementations, each variable resistance element is driven by two transistors positioned at both sides of the variable resistance element in the first direction and coupled to an interconnection line coupled to the variable resistance element.

In some implementations, the electronic devices may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic devices may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic devices may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic devices may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic devices may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method is provided for fabricating an electronic device including a semiconductor memory. The semiconductor memory comprises: selectively etching a substrate to form a plurality of line patterns extending in a second direction; forming a source line to be buried in a part of a space between the line patterns so that the source line contacts with the line patterns at both sides of the source line, and that the source line extends in the second direction; selectively etching upper portions of the line patterns to form a plurality of pillar patterns arranged in the second direction and in a first direction crossing the second direction; forming a word line to be in contact with sidewalls of the pillar patterns arranged in the first direction and to extend in the first direction; forming, over the pillar patterns, an interconnection line extending in the first direction so as to be coupled to the pillar patterns which are arranged in the first direction; forming, over the interconnection line, variable resistance elements positioned between the pillar patterns which are adjacent to each other in the first direction; and forming, over the variable resistance element, a bit line extending in the second direction so as to be coupled to the variable resistance elements arranged in the second direction.

In some implementations, the method may further comprises: before the forming of the source line, forming a first insulating layer pattern to have openings to expose parts of both sidewalls of the line patterns, wherein the source line is coupled to the line patterns through the openings.

In some implementations, the method may further comprises: before the forming of the source line, forming a first insulating layer pattern to have openings to expose parts of both sidewalls of the line patterns and the substrate positioned between the both sidewalls, wherein the source line is coupled to the line patterns through the openings.

In some implementations, the forming of the pillar patterns may comprise selectively etching the upper portions of the line patterns by a depth at which the source line is not exposed.

In some implementations, the word line is positioned below upper surfaces of the pillar patterns.

In another aspect, an electronic device is provided to include a semiconductor memory, that includes: a substrate including a plurality of line patterns and a plurality of pillar patterns, the plurality of line patterns being protruding from the substrate and having openings formed on both sidewalls of the respective line patterns, and the plurality of pillar patterns being positioned above the plurality of line patterns; a source line being formed between the adjacent line patterns arranged in a first direction to be in contact with the openings; a word line being formed on both sidewalls of each pillar pattern; an interconnection line being coupled to the pillar patterns arranged in the first direction and having a variable resistance element formed thereon, the variable resistance element being in contact with a bit line positioned above the pillar patterns.

In some implementations, the upper surfaces of the source lines are positioned at the same or greater height than the upper surfaces of the corresponding openings.

In some implementations, the bottom surfaces of the word lines are positioned to be higher than the source lines and the height of the top surfaces of the word lines are positioned to be lower than the height of the top surfaces of the pillar patterns.

In some implementations, the plurality of line pattern have openings on the substrate between the adjacent line patterns arranged in the first direction in addition to the openings formed on both sidewalls of the respective line patterns.

In some implementations, the word lines formed on the pillar patterns intersect with the source lines formed on the line patterns positioned below the pillar patterns.

In another aspect, an electronic device is provided to include a semiconductor memory that includes: a plurality of pairs of source lines and bit lines being arranged in a first direction; a plurality of word lines being arranged in a second direction crossing the first direction; and a plurality of interconnection lines, each having a plurality of interconnection points, each interconnection point being coupled to a resistance element and enabling the corresponding resistance element to be coupled to two transistors arranged in the first direction and positioned at the opposite sides of the resistance element.

In some implementations, the plurality of word lines are positioned over the plurality of source lines.

In some implementations, the semiconductor memory comprises: a transistor having three terminals coupled to a word line, source line, interconnection line, respectively; wherein the source line is positioned below the word line in a vertical direction and extended in a direction perpendicular to the direction that the word line extends.

In some implementations, the electronic device further comprises: a bit line positioned above the source line in a vertical direction, and a variable resistance element coupled to the interconnection line and the bit line.

These and other aspects, implementations and associated advantages are described in greater detail in the drawings, the description and the claims.

DETAILED DESCRIPTION

Figure 1A:
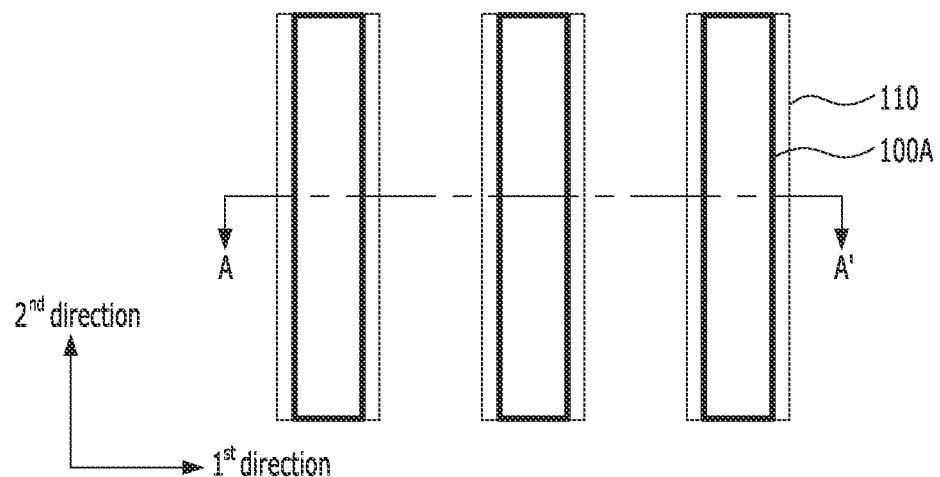
FIGS. 1A to 5C are views explaining a semiconductor device and a method for fabricating the semiconductor device.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Hereinafter, a semiconductor device and a method for fabricating the same according to an implementation will be described with reference to FIGS. 1A to 6.

Figure 3A:
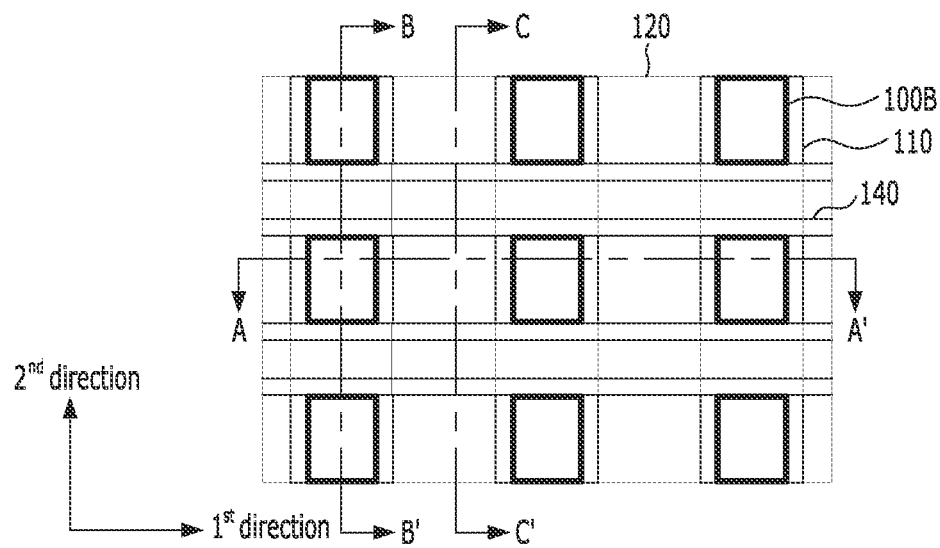
Figure 3B:
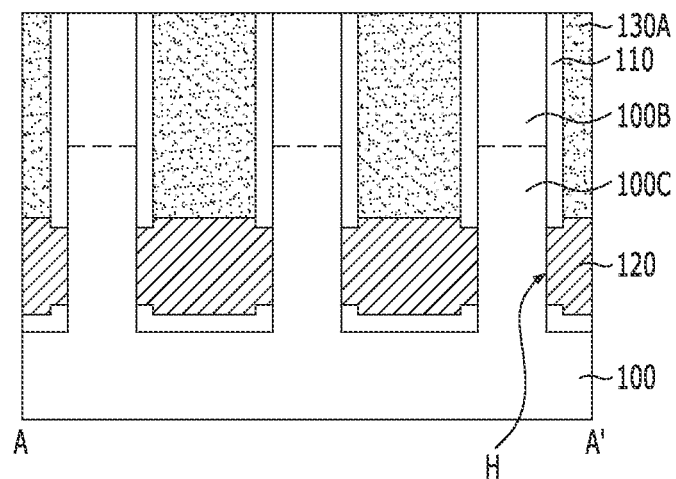
Figure 3C:
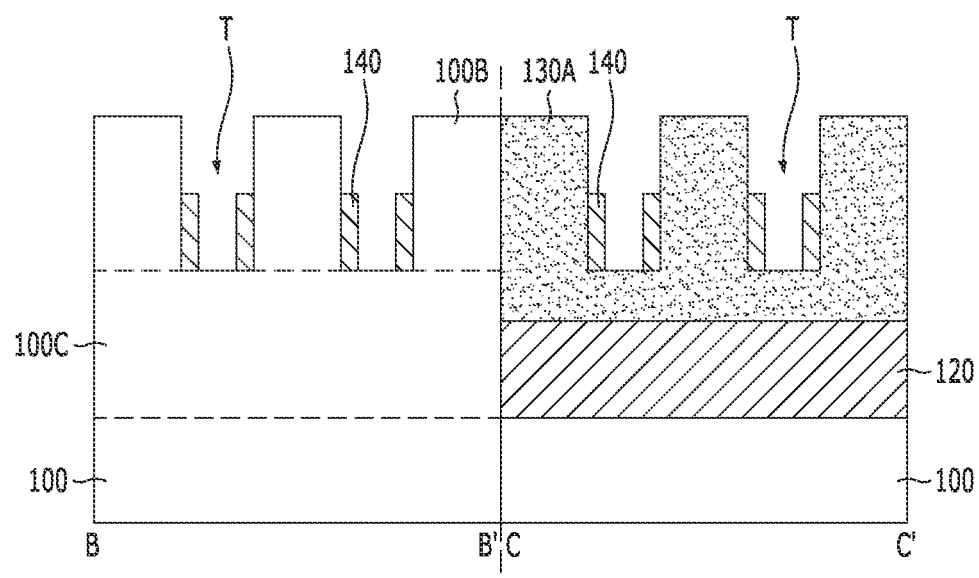
Figure 4A:
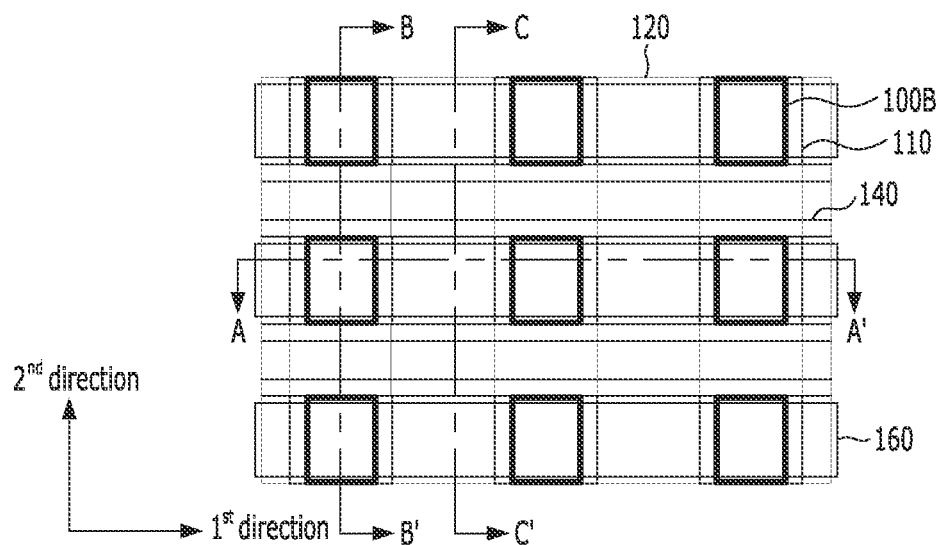
Figure 4B:
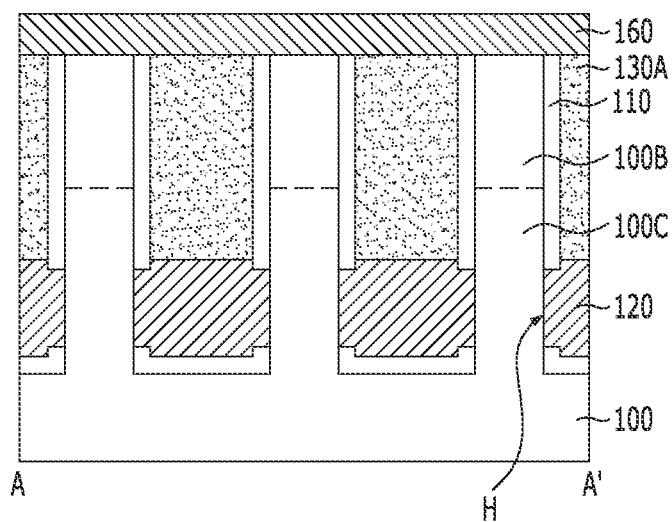
Figure 4C:
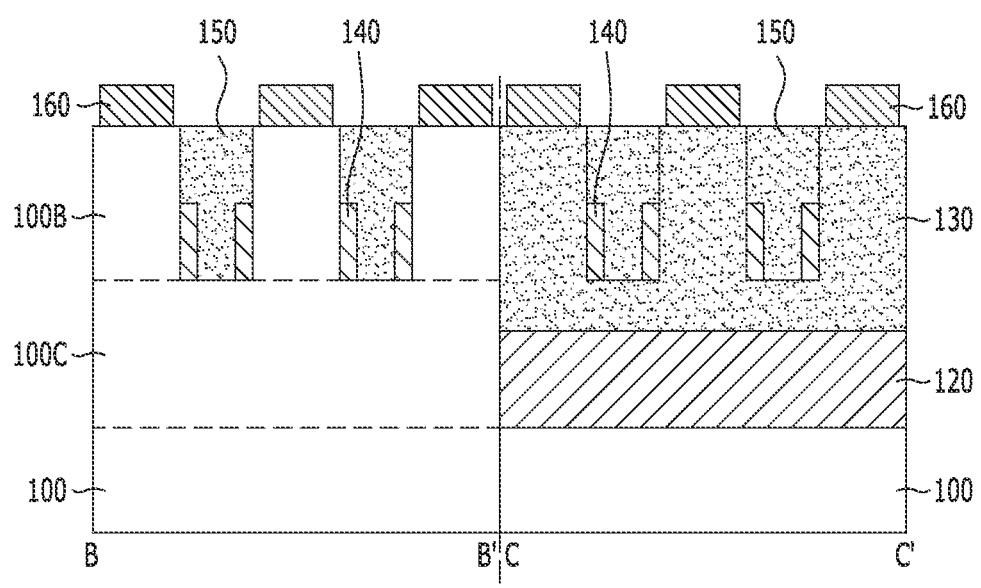
Figure 5A:
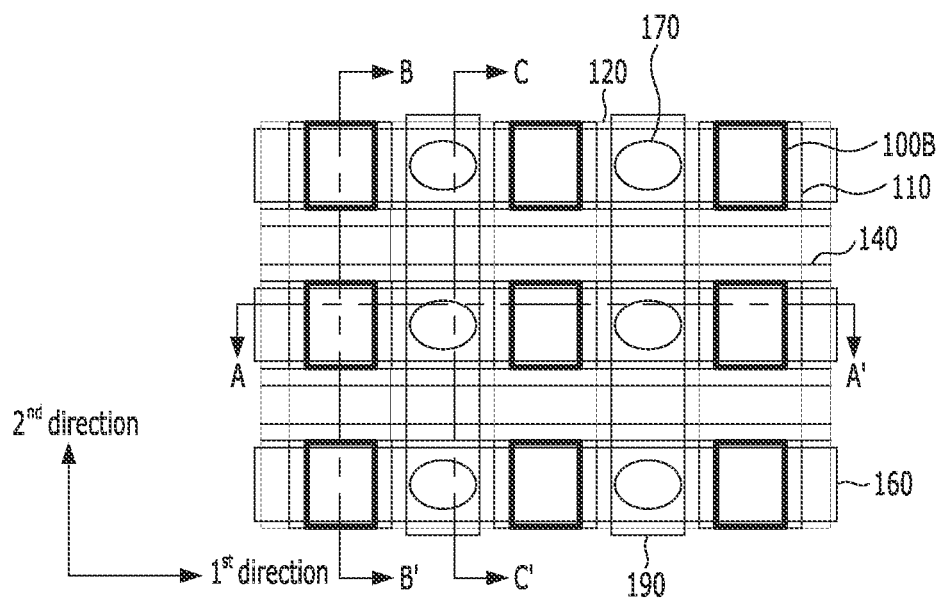
Figure 5B:
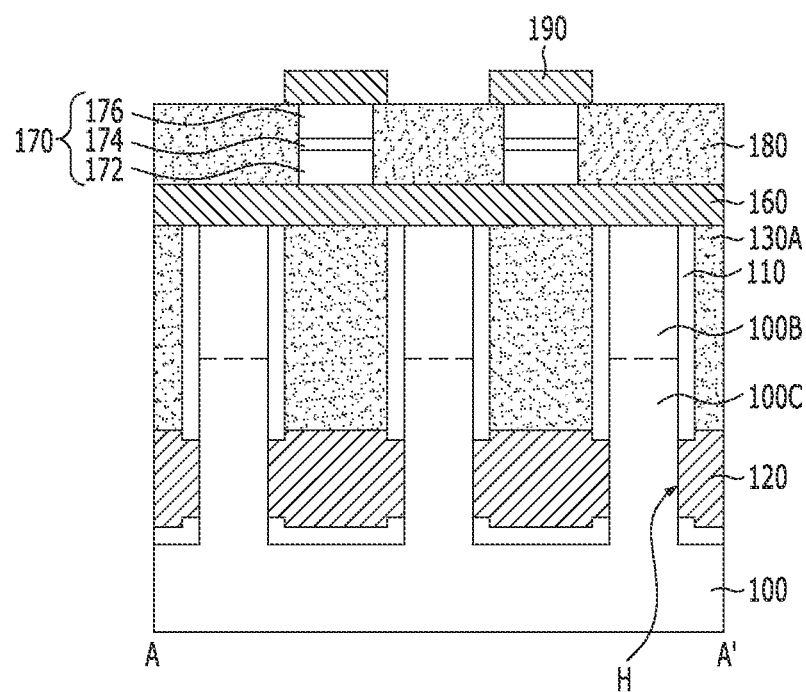
Figure 5C:
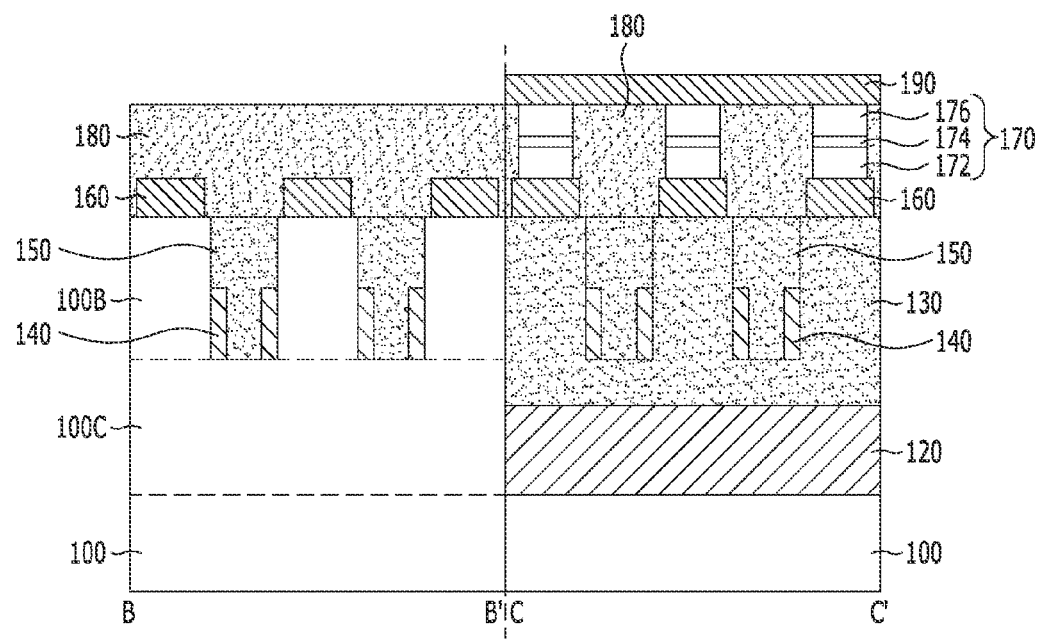

FIGS. 1A to 5C are views explaining a semiconductor device and a method for fabricating the same according to an implementation. FIGS. 1A to 4C illustrate an example of a process for fabricating a semiconductor device. FIGS. 5A to 5C illustrate an example of the semiconductor device manufactured according to the fabricating method of FIGS. 1A to 4C. In numbering drawings, the suffix "A" illustrates plan views, suffix "B" illustrates cross-sectional views taken along the lines A-A' of the corresponding plan views, and the suffix "C" illustrates cross-sectional views taken along the lines B-B' and C-C'. corresponding plan views.

First, a fabricating method will be described.

Figure 1B:
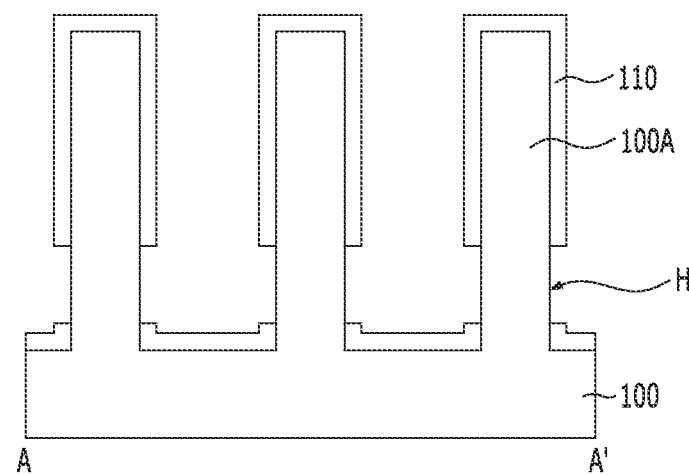

Referring to FIGS. 1A and 1B, a substrate 100 is selectively etched to form a plurality of line patterns 100A which vertically protrude from the substrate 100. The protruded direction of the line patterns above the substrate 100 is in a direction perpendicular to the substrate 100.

Here, the substrate 100 may include semiconductor material such as silicon or the like. The line patterns 100A are formed to be a part of the substrate 100, which may be made of the same material as the substrate 100. The plurality of line patterns 100A may be arranged at a predetermined interval in a first direction and may be extended in a second direction.

In addition, a first insulating layer pattern 110 is formed on the line patterns 100A to define openings H, by which parts of both sidewalls of the respective line patterns 100A are exposed.

Here, the openings H may be positioned on the sidewalls of the line patterns 100A and be downwardly spaced apart in a vertical direction from the top surfaces of the line patterns 100A. The openings H may have a constant length in the vertical direction. The openings H formed on the single line pattern 100A may be positioned at opposite sides of the line pattern 100. In addition, the openings H may be formed in a line shape which is extended in the second direction along the sidewalls of the line patterns 100A.

Figure 8:
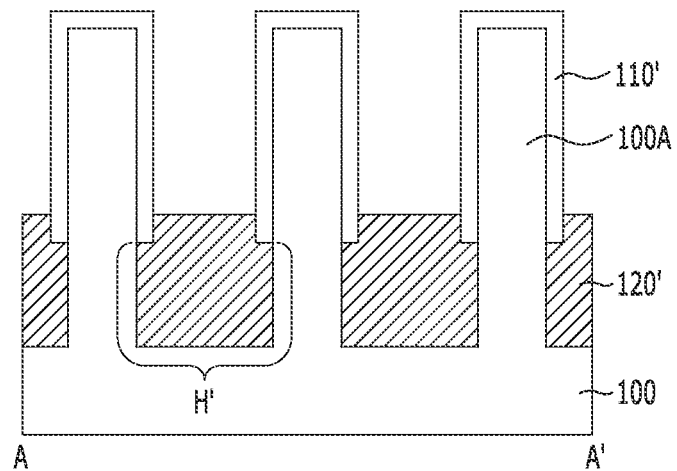
FIG. 8 is a view explaining a semiconductor device.

The first insulating layer pattern 110 may include a single layer or multiple layers which include an insulating material, such as an oxide, a nitride, or the like. According to an implementation, the first insulating layer pattern 110 may be formed to surround the line patterns 110 except the areas defining the openings. As illustrated in a specific example of FIG. 1B, the first insulating layer pattern 110 exists (1) on the sidewalls of the line patterns 100A except the areas for the openings H, (2) on the top surfaces of the line patterns 100A, and (3) on the top surfaces of the substrate 100 between the line patterns 100A. However, other implementations are possible. The first insulating layer pattern 110 exposes parts of both sidewalls of the respective line patterns 100A, which are downwardly located apart by a predetermined distance from the top surfaces of the line patterns 100A. As will be explained later, the exposed parts of the sidewalls of the line patterns 110A are to be in contact with source lines 120. In various configurations, the first insulating layer pattern 110 may have various shapes. For example, an first insulating layer pattern 110 may be shaped as illustrated in FIGS. 8 to 9B details of which will be described later.

Although not shown, an impurity region may be formed after the first insulating layer pattern 110 is formed. In one implementation, an impurity region may be formed by doping impurities into the line patterns 100A exposed by the openings H. In other implementations, a metal silicide may be formed in the line patterns 100A exposed by the openings H by forming a metal-containing layer on the entire surface of the resultant structure that is obtained after the first insulating layer pattern 110A has been formed and performing an annealing process. Such impurity regions can be used to form vertical channel transistors to achieve a higher degree of integration of a cell array based on variable resistance elements.

Figure 2A:
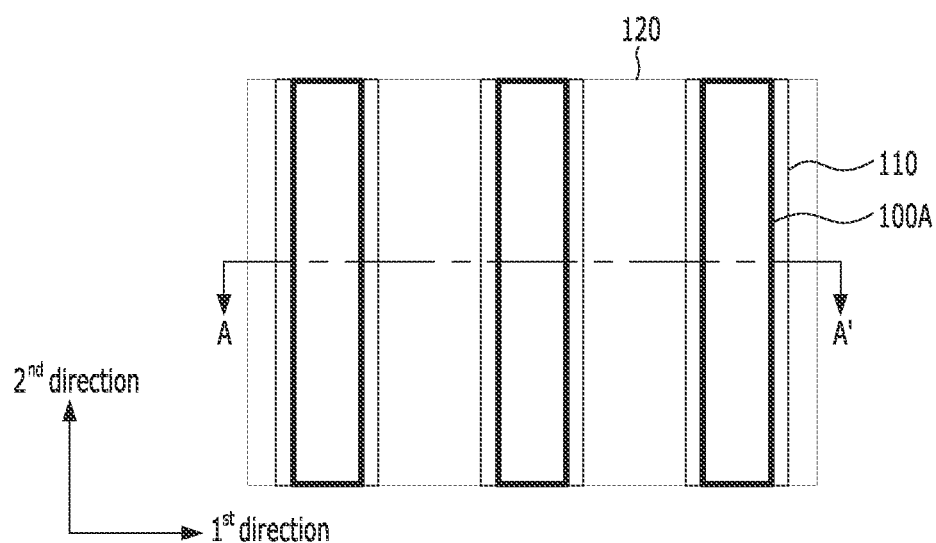
Figure 2B:
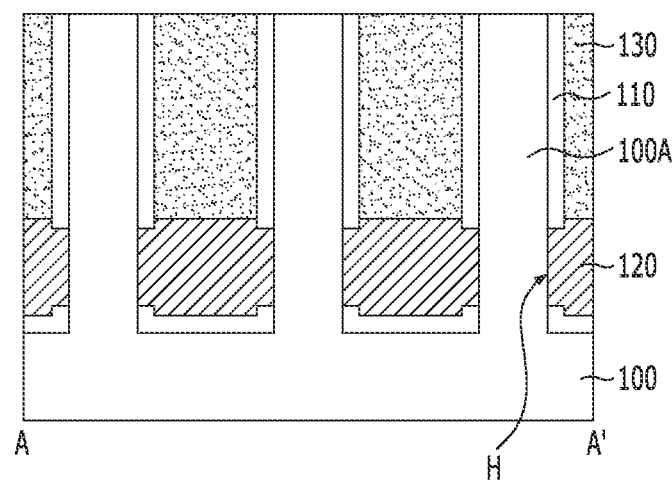

Referring to FIGS. 2A and 2B, a part of the space between the line patterns 100A is filled with a conductive material to form a source line 120 extended in the second direction. The source line 120 may be formed to be in contact with the entire surface of each opening H. The upper surface of the source line 120 may be positioned at the same height as the upper surface of the opening H or at a height greater than the upper surface of the opening H.

The source line 120 may be formed by, for example, forming a conductive material on the resultant structure of FIGS. 1A and 1B and performing an etching process on the formed conductive material until a desired height is obtained. The conductive material used for forming the source line 120 may include, for example, a metal, such as Cu, W, Ta, or the like, or a metal nitride, such as TiN or the like.

Subsequently, the remaining space between the line patterns 100A that has not been used for forming the source line 120 is filled to form a second insulating layer 130.

The second insulating layer 130 may include various insulating materials, such as an oxide, a nitride, and the like. In addition, the second insulating layer 130 may be formed by, for example, forming an insulating material covering a resultant structure that is obtained after forming the source line 120 and performing a planarization process, e.g. a chemical mechanical polishing (CMP) process, until the top surfaces of the line patterns 100A are exposed.

Referring to FIGS. 3A to 3C, top parts of the line patterns 100A are selectively etched to form a pillar pattern 100B having an island shape on a plane. Hereinafter, the bottom parts of the line patterns 100A which are not etched and left will be indicated by reference numeral "100C". The pillar pattern 100B may be arranged in a matrix type in the first and second directions and vertically protrude from the line patterns 100C.

The pillar patterns 100B may be formed by, for example, forming a mask pattern (not shown) of a line shape extended in the first direction on the resultant structure of FIGS. 2A and 2B, and etching the line patterns 100A to a predetermined depth using the mask pattern as an etch barrier. The etching of the line patterns 100A may be performed to a depth ensuring that the source line 120 is not exposed. During the etching of the line patterns 100A, the second insulating layer 130 exposed by a mask pattern may be etched together with the line patterns 100A. Hereinafter, the etched second insulating layer 130 will be referred to as a second insulating layer pattern 130A. Accordingly, as shown in FIG. 3C, a line-shaped trench T extended in the first direction may be formed between adjacent pillar patterns 100B and between adjacent second insulating layer patterns 130A in the second direction.

Subsequently, a word line 140 is formed on both sidewalls of the trench T, which is extended in the first direction.

The word line 140 may be formed by the following processes. For example, a conductive material is formed on the entire surface of the resultant structure obtained after forming the trench T. An etching is performed on an entire surface to mutually separate the conductive materials on one sidewall and the other sidewall of the trench T. The conductive material used for forming the word line 140 may include, for example, a metal, such as Cu, W, Ta, or the like, or a metal nitride, such as TiN or the like. In addition, the top surface of the word line 140 may be positioned below the top surface of the pillar pattern 100B. In this case, it is easier and simpler to insulate the word line 140 from an interconnection line which is described later. Although not shown, a gate insulating layer may be interposed between the word line 140 and the pillar pattern 100B.

The pillar patterns 100B arranged in the first direction form the column of the pillar pattern 100B. The word lines 140 positioned at both sides of the column of the pillar pattern 100B are shown as separated from each other in the drawings, but their respective end terminals are coupled to each other to function as a single word line 140 so that both-sided word lines 140 of the column of the one pillar pattern 100B are part of one word line 140.

The word line 140 formed on the pillar pattern 100B may intersect with the source line 120 formed on the line patterns 100C, which are positioned below the pillar pattern 100B.

Referring to FIGS. 4A to 4C, a third insulating layer 150 is formed by filling the remaining space of the trench T after the word line 140 has been formed.

The third insulating layer 150 may include various insulating materials such as an oxide, a nitride, and the like. In addition, the third insulating layer 150 may be formed in the following manner. An insulating material is formed to cover the resultant structure of FIGS. 3A to 3C. A planarization process is performed until the top surfaces of the pillar pattern 100B are exposed.

Subsequently, an interconnection line 160 is formed on the resultant structure that is obtained after the third insulating layer 150 has been formed to be in contact with the column of the pillar pattern 100B arranged in the first direction.

The interconnection line 160 may be made of a conductive material, such as a metal, a metal nitride, or the like. In addition, the interconnection line 160 may be formed by depositing a conductive material on the resultant structure that is obtained after the third insulating layer 150 has been formed, and then by selectively etching the conductive material. In other implementations, the interconnection line 160 may be formed by depositing an insulating material (not shown) on the resultant structure that is obtained after the third insulating layer 150 has been formed, selectively etching the insulating material to form a space in which the interconnection line 160 is to be formed, and then filling the space with a conductive material.

Referring to FIGS. 5A to 5C, variable resistance elements 170 are formed on the interconnection line 160 to be positioned between adjacent pillar patterns 100B arranged in the first direction. The variable resistance elements 170 may be arranged on one straight line in the second direction.

The variable resistance elements 170 can store data using a characteristic switched between different resistance states according to a voltage or current applied to both terminals thereof. For example, a variable resistance element 170 may store data "0" when the variable resistance element 170 is at a low resistance state, while storing data "1" when the variable resistance element 170 is at a high resistance state. Such a variable resistance element 170 may be configured with a single layer or multiple layers which include materials used in an ReRAM, a PCRAM, an MRAM, an FRAM, and the like, for example, a transition metal oxide, a metal oxide such as a perovskite-based material, a phase change material such as a chalcogenide-based material or the like, a ferroelectric material, a ferromagnetic material, and the like. The present implementation illustrates, as the variable resistance element 170, a magneto resistive element including a structure in which a lower magnetic layer 172, a tunnel barrier layer 174, and an upper magnetic layer 176 are stacked. However, other implementations are possible, and various materials or structures that can be switched between different resistance states can be used for the variable resistance element 170.

A variable resistance element 170 may be formed, for example, by forming a material layer on the resultant structure of FIGS. 4A and 4B and then selectively etching the material layer.

Subsequently, a fourth insulating layer 180 may be formed to fill the space between the variable resistance elements 170. The fourth insulating layer 180 may include an insulating material such as an oxide, a nitride, or the like.

Subsequently, a bit line 190 is formed on the fourth insulating layer 180 to be in contact with the variable resistance elements 170 arranged in the second direction. The bit line is extended in the second direction.

The bit line 190 may be made of a conductive material, such as a metal, a metal nitride, or the like. The bit line 190 may be formed in various manners. In one implementation, the bit line 190 may be formed by depositing a conductive material on the resultant structure that is obtained after the variable resistance element 170 and fourth insulating layer 180 have been formed, and then selectively etching the conductive material. In other implementations, the bit line 190 may be formed by depositing an insulating material (not shown) on the resultant structure that is obtained after the variable resistance element 170 and fourth insulating layer 180 have been formed, selectively etching the insulating material so as to form a space for the bit line 190, and then filling the space with a conductive material.

According to the processes described above, a semiconductor device as illustrated in FIGS. 5A to 5C may be provided.

As shown in FIGS. 5A to 5C, a plurality of line patterns 100C are formed to protrude vertically from the substrate 100 and be extended in the second direction. A plurality of pillar patterns 100B are formed to protrude vertically from the line patterns 100C and be arranged in a matrix form in the first and second directions.

The source lines 120 are arranged between the adjacent line patterns 100C to be in contact with parts of both sidewalls of each of the line patterns 100A through the openings H formed on the first insulating layer pattern 110 and are extended in the second direction.

The word lines 140 are formed on both sidewalls of the pillar patterns 100B in the second direction and extended in the first direction. The word lines 140 can be insulated from the interconnection lines 160 because the height of the top surfaces of the word lines 140 are positioned to be lower than the height of the top surfaces of the pillar patterns 100B. The word lines 140 can be insulated from the source lines 120 because the bottom surfaces of the word lines 140 are positioned to be higher than the source lines 120.

The interconnection lines 160 extended in the first direction are formed to be coupled to the pillar pattern 100B arranged in the first direction.

The variable resistance elements 170 are formed on the interconnection lines to be positioned between adjacent pillar patterns 100B arranged in the first direction.

The bit lines 190 are formed on the variable resistance elements 170 so as to be coupled to the variable resistance elements 170 arranged in the second direction. The bit lines are extended in the second direction.

The aforementioned implementations of the semiconductor device structures and the fabricating methods may be used to achieve one or more advantages as discussed below.

First, vertical channel transistors, the pillar patterns 100B perpendicular to the substrate 100 and word lines 140 in contact with the sidewalls of the pillar patterns 100B can be used to greatly improve the degree of integration of a semiconductor device a semiconductor device using planar-type transistors.

In addition, the disclosed structures and fabrication techniques enable a novel memory cell array using vertical channel transistors different from a DRAM cell array using the vertical channel transistors. In a conventional DRAM cell array using vertical channel transistors connected to bilines and word lines it is sufficient that only one of the two terminals of a capacitor is coupled to a transistor in order to be controlled by the transistor. This is different from a memory cell array based on variable resistance elements coupled to source lines, bit lines and word lines as disclosed in this document, because both terminals of each variable resistance element need to be controlled. Therefore, the vertical channel transistor design of a DRAM cannot be adopted for cell arrays using variable resistance elements as disclosed in this document. In order to provide a cell array including variable resistance elements, source lines 120 are formed in a space between line patterns 100C and bit lines 190 are formed on pillar patterns 100B.

In another aspect, the interconnection lines 160 can enable one variable resistance element to be coupled to two vertical channel transistors in the first direction, thereby increasing the current driving capability in switching the variable resistance element 170. Thus, a semiconductor device based on the technology disclosed in this document can be optimized for providing high current. For example, a semiconductor device can effectively provide high current in switching the variable resistance element 170 which is configured with a magneto-resistive element.

Moreover, unlike a DRAM, a semiconductor device according to the present implementation does not require a One-Side-Contact (OSC) structure to be implemented, and thus, the process can be simplified. In the conventional DRAM, capacitors are formed on pillars, and bit lines are formed between the pillars. In this case, however, a problem exists that two memory cells are coupled to one bit line since a bit line is coupled to both pillars formed at opposite sides thereof. In order to address such a problem, a so-called OSC structure has been adopted in the DRAM to couple a bit line to only one of both-sided pillars. However, in order to implement the OSC structure, very complicated processes are needed and include, for example, a plurality of processes of forming and removing a linear layer and a sacrificial layer; a tilt implantation process; a plurality of masking and etching processes; and others. A semiconductor device based on the disclosed technology in this document is specifically configured to be free of the OSC structure by forming a source line 120 to be in contact with both sidewalls of the respective line patterns 100B. Thus, it is possible to control one variable resistance element 170 with two vertical channel transistors without an OSC structure. Accordingly, the device fabrication process can be simplified. Such a characteristic of the disclosed technology will be described in detail later with reference to FIGS. 7A to 7D.

Figure 6:
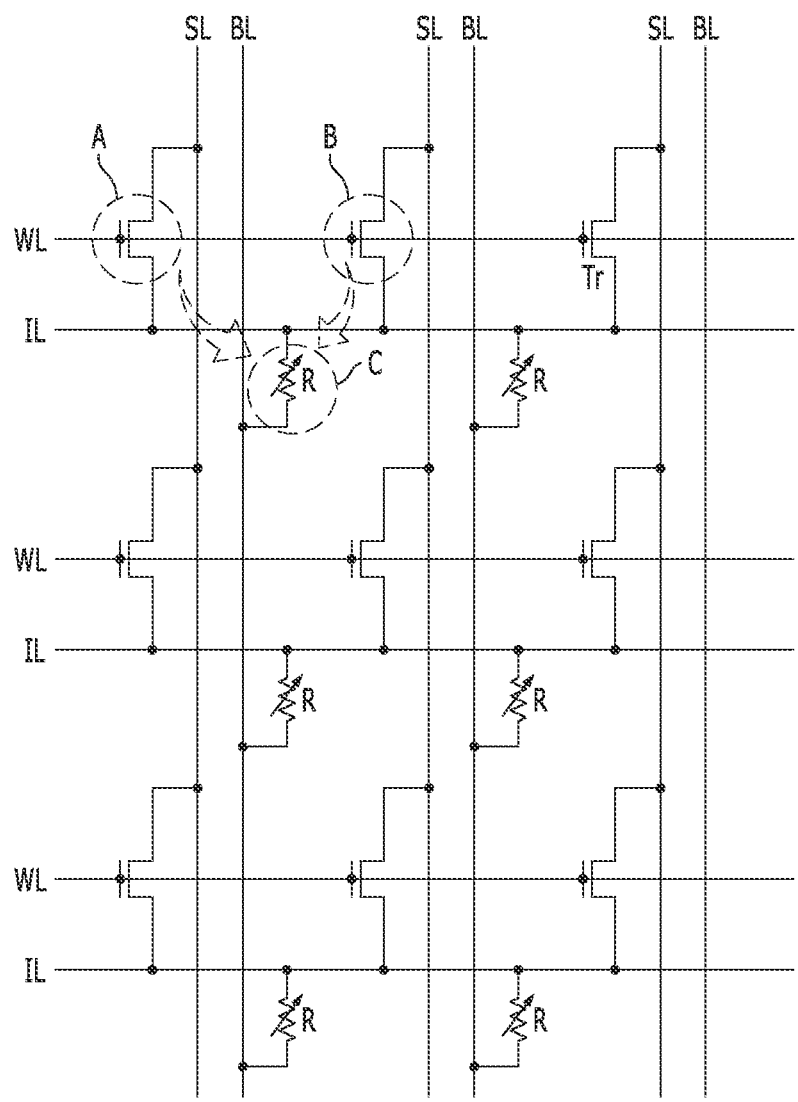
FIG. 6 is a circuit diagram illustrating the configuration of a semiconductor device.

FIG. 6 is a circuit diagram illustrating the configuration of a semiconductor device, which is an equivalent circuit of the semiconductor device in FIGS. 5A to 5C.

Referring to FIG. 6, a semiconductor device includes word lines WL and interconnection lines IL which are extended in a first direction, and source lines SL and bit lines BL which are extended in a second direction. A pair of a word line WL and an interconnection line IL are repeatedly formed in the second direction, and a pair of a source line SL and a bit line BL are repeatedly formed in the first direction.

One transistor Tr is arranged in every interconnection points in which a source line SL and a pair of word line WL and interconnection line IL intersect each other. One terminal of a transistor Tr is coupled to a corresponding source line SL, another terminal of the transistor Tr is coupled to a corresponding interconnection line IL, and the gate of the transistor Tr is coupled to a corresponding word line WL.

One variable resistance element R is provided in every interconnection points in which a bit line BL and an interconnection line IL intersect each other. One terminal of a variable resistance element R is coupled to a corresponding interconnection line IL, and the other terminal thereof is coupled to a corresponding bit line BL. If a variable resistance element R and two adjacent transistors arranged in the first direction are coupled to a common interconnection line IL, the coupling node on the common interconnection line IL coupled to the variable resistance element R may be positioned between the coupling node on the common interconnection line IL coupled to one of the two adjacent transistors Tr and the coupling node on the common interconnection line IL coupled to the other of the two adjacent transistors Tr.

In FIG. 6, source lines SL and bit lines BL are referred to as a first, second, and third source line and a first, second, and third bit line, respectively, from the left to the right. A word line WL and an interconnection line IL are referred to as a first, second, and third word line and a first, second, and third interconnection line, respectively, from the top to the bottom. A transistor having three terminals coupled to the first source line, the first word line, and the first interconnection line is referred to as a first transistor (shown as a dotted circle A in FIG. 6) and a transistor having three terminals coupled to the second source line, the first word line, and the first interconnection line is referred to as a second transistor (shown as a dotted circle B in FIG. 6). A variable resistance element R coupled to the first bit line and the first interconnection line is referred to as a first variable resistance element (shown as a dotted circle C in FIG. 6). A coupling node on the first interconnection line coupled to the first variable resistance element may be positioned between a coupling node on the first interconnection line coupled to the first transistor and a coupling node on the first interconnection line coupled to the second transistor.

Accordingly, as indicated by dotted arrows in FIG. 6, the first variable resistance element may be driven by the first and second transistors.

Similarly, A transistor having three terminals coupled to the third source line, the first word line, and the first interconnection line is referred to as a third transistor. A variable resistance element R coupled to the second bit line and the first interconnection line is referred to as a second variable resistance element. A coupling node on the first interconnection line coupled to the second variable resistance element may be positioned between a coupling node on the first interconnection line coupled to the second transistor and a coupling node on the first interconnection line coupled to the third transistor.

Accordingly, the second variable resistance element may be driven by the second and third transistors.

FIGS. 7A to 7D are views explaining an example of a method for forming a first insulating layer pattern shown in FIGS. 1A and 1B.

Figure 7A:
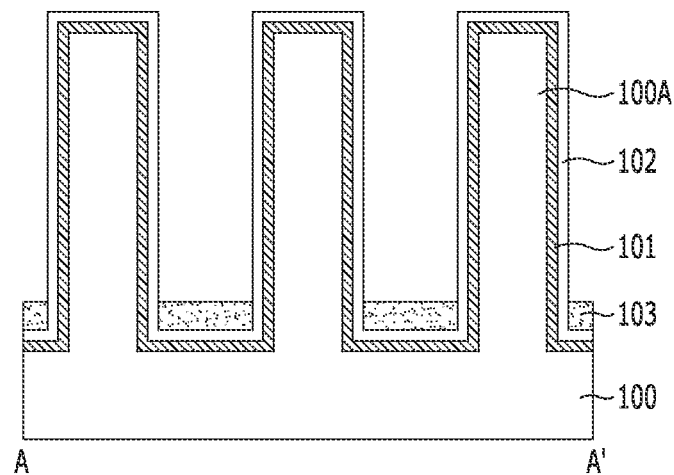
FIGS. 7A to 7D are views exemplarily explaining a method for forming a first insulating layer pattern shown in FIGS. 1A and 1B.

Referring to FIG. 7A, a substrate 100 is selectively etched to form line patterns 100A, and then a fifth insulating layer 101 and a sixth insulating layer 102 are formed on the entire surface of the resultant structure that is obtained after selectively etching the substrate 100. In this case, the fifth insulating layer 101 and sixth insulating layer 102 may be formed with materials having different etch rates from each other. For example, the fifth insulating layer 101 may be formed with an oxide layer, and the sixth insulating layer 102 may be formed with a nitride layer.

Subsequently, a first sacrificial layer 103 is formed on the sixth insulating layer 102 to fill a part of the space between the line patterns 100A. The first sacrificial layer 103 may be formed in various manners. For example, a material layer for the first sacrificial layer 103 may be formed on the sixth insulating layer 102 which has a thickness to sufficiently fill the space between the line patterns 100A. Then, an etch-back process is performed on the material layer until the first sacrificial layer 103 has a desired height. In this case, the height of the first sacrificial layer 103 may be equal to the height of the lowermost of the openings H shown in FIG. 1B. In addition, the first sacrificial layer 103 may be formed with a material layer including, for example, an amorphous carbon layer, silicon-containing layer, or the like, which has an etch rate different from those of the fifth and sixth insulating layers 101 and 102.

Figure 7B:
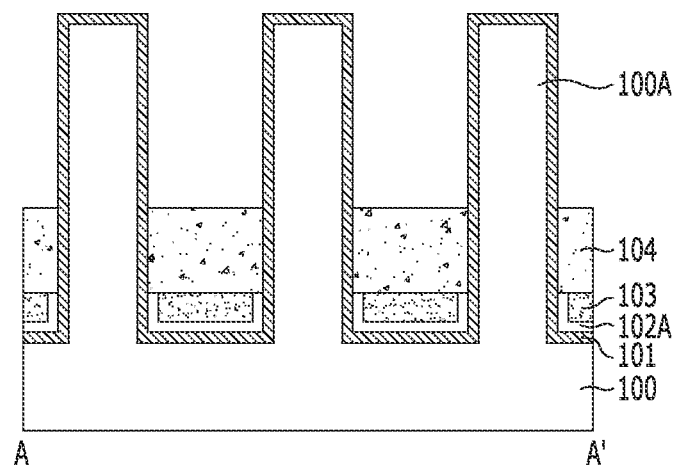

Referring to FIG. 7B, a sixth insulating layer pattern 102A is formed by removing the sixth insulating layer 102 exposed by the first sacrificial layer 103. The removal of the sixth insulating layer 102 may be performed in a wet-etching or dry-etching way using a difference between a etch rate of the first sacrificial layer 103 and a etch rate of the sixth insulating layer 102. Upon completing the above process, a part of the space between the line patterns 100A is filled with the sixth insulating layer pattern 102A and the first sacrificial layer 103, which have substantially the same height.

Subsequently, a second sacrificial layer 104 is formed on the sixth insulating layer pattern 102A and the first sacrificial layer 103 to fill a part of the space between the line patterns 100A. The second sacrificial layer 104 may be formed in various manners. For example, a material layer for the second sacrificial layer 104 is formed on the resultant structure that is obtained after forming the sixth insulating layer pattern 102A and the first sacrificial layer 103. The material layer may have a thickness to sufficiently fill the space between the line patterns 100A. Then, an etch-back process is performed on the material layer until the second sacrificial layer 104 has a desired height. In this case, the height of the second sacrificial layer 104 may be equal to the height of the uppermost parts of the openings H shown in FIG. 1B. In addition, the second sacrificial layer 104 may be formed with a material layer including, for example, an amorphous carbon layer, a silicon-containing layer, or the like, which has an etch rate different from those of the fifth and sixth insulating layers 101 and 102. In addition, the second sacrificial layer 104 may be formed with the same material layer as the first sacrificial layer 103.

Figure 7C:
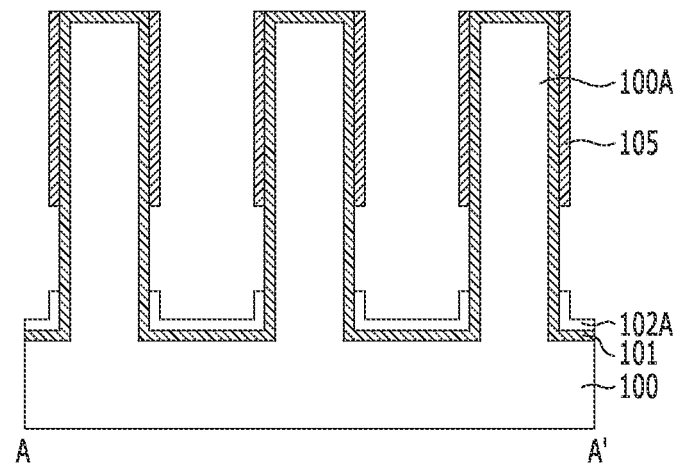

Referring to FIG. 7C, a seventh insulating layer 105 is formed on the sidewalls of the fifth insulating layer 101 exposed by the second sacrificial layer 104. The seventh insulating layer 105 may be formed in various manners. For example, an insulating material is formed on the entire surface of the resultant structure of FIG. 7B. Then, the entire surface of the insulating material is etched until the second sacrificial layer 104 is exposed. The seventh insulating layer 105 may be formed with a material having an etch rate different from those of the first sacrificial layer 103, the second sacrificial layer 104, and the fifth insulating layer 101. For example, the seventh insulating layer 105 may be formed with a nitride layer.

Subsequently, the second sacrificial layer 104 exposed by the seventh insulating layer 105 is removed, and then the first sacrificial layer 103 exposed by the removal of the second sacrificial layer 104 is removed. The removal of the first and second sacrificial layers 103 and 104 may be performed in a wet-etching or dry-etching way using a difference of etch rates between one of the first and second sacrificial layers 103 and 104 and one of the fifth to seventh insulating layers 101, 102 and 105.

Figure 7D:
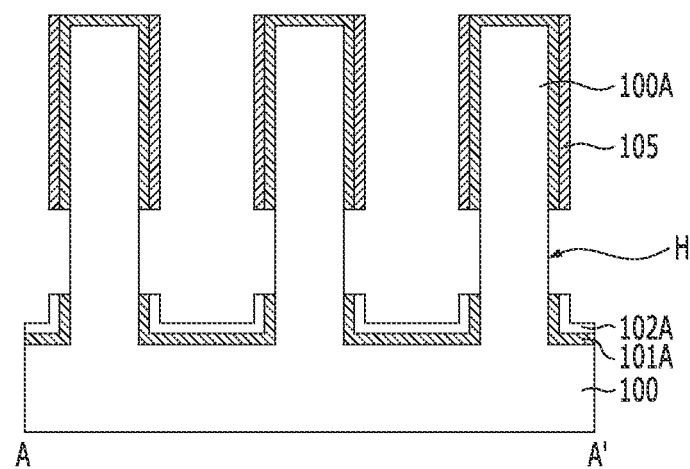

Referring to FIG. 7D, openings H exposing parts of both sidewalls of the line patterns 100A are formed by removing a part of the fifth insulating layer 101 exposed by the sixth insulating layer pattern 102A and seventh insulating layer 105. Hereinafter, the fifth insulating layer 101 which has a part removed will be referred to as a fifth insulating layer pattern 101A. The removal of the fifth insulating layer 101 may be performed in a wet-etching or dry-etching way using a difference of etch rates between the fifth insulating layer 101 and the sixth or seventh insulating layers 102 and 105.

Upon completing the above process, a structure as shown in FIGS. 1A and 1B may be formed. The openings H shown in FIG. 7D are substantially the same as the openings H shown in FIGS. 1A and 1B. The fifth insulating layer pattern 101A, the sixth insulating layer pattern 102A, and the seventh insulating layer 105 shown in FIG. 7D corresponds to the first insulating layer pattern 110 shown in FIGS. 1A and 1B.

The above processes are performed for exposing parts of both sidewalls of each line pattern 100A. Processes for implementing an OSC structure generally requires a tilt ion implantation process and a mask process to expose only one of both sidewalls of the line pattern 100A. Compared to processes for implementing an OSC structure, the above processes for implementing openings on parts of both sidewalls of each line pattern 100A has a lower level of difficulty While the aforementioned implementation has been described with respect to the case where only parts of both sidewalls of the line patterns 100A are exposed by openings H, other implementations are possible. This is because, since each source line 120 has only to be in contact with all the line patterns 100A disposed at both sides of the source line 120, as described above, it is sufficient for the openings H to expose a part of both sidewalls of the line patterns 100A downwardly from a position spaced by a predetermined depth downwardly from the top surface of the line patterns 100A. This will be exemplarily described with reference to FIG. 8.

FIG. 8 is a view explaining the configuration of a semiconductor device. Compared to the implementation as described with regard to FIGS. 1A to 5C, a semiconductor device includes a modified first insulating layer pattern and modified source lines.

Referring to FIG. 8, the openings H' of first insulating layer pattern 110' are formed to expose the substrate 100 between the line patterns 100A as well as a part of both sidewalls of line patterns 100A. For example, the openings H' further exposes the substrate 100 between the line patterns that are adjacent from each other in the first direction as well as the line patterns 100A' which are positioned at a predetermined distance from the top surface of the line patterns 110A'. Accordingly, the first insulating layer pattern 110' can be positioned on the upper parts of the line patterns 100A. As illustrated in an example of FIG. 8, the first insulating layer pattern 110' is positioned on the top surfaces and upper parts of sidewalls of the line patterns 100A.

Source lines 120' may be extended in the second direction while being in contact with the substrate 100 and the line patterns 100A which are exposed by the openings H'.

The present implementation can acquire substantially the same advantages as the aforementioned implementation that openings are formed on only sidewalls of line patterns. In addition, the present implementation can further reduce the degree of difficulty of the process by simplifying the shape of the first insulating layer pattern 110'. This will be described below in more detail with reference to FIGS. 9A and 9B.

Figure 9A:
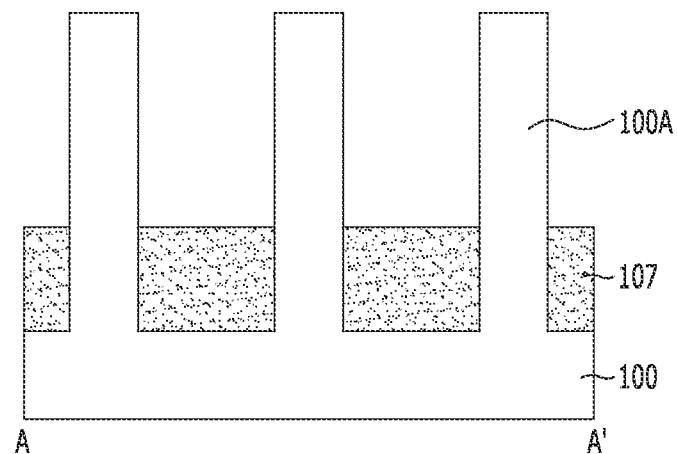
FIGS. 9A and 9B are views exemplarily explaining a method for forming a first insulating layer pattern shown in FIG. 8.
Figure 9B:
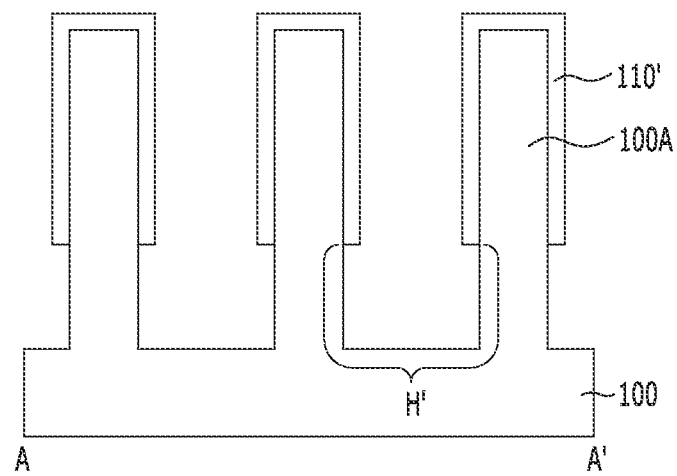

FIGS. 9A and 9B are views explaining an example of a method for forming the first insulating layer pattern shown in FIG. 8.

Referring to FIG. 9A, a substrate 100 is selectively etched to form line patterns 100A, and then a sacrificial layer 107 is formed to fill a part of the space between the line patterns 100A. The sacrificial layer 107 may be formed in various manners. For example, a material layer for the sacrificial layer 107 is formed on the substrate 100 having line patterns to have a thickness to sufficiently fill the space between the line patterns 100A. Then, an etch-back process is performed on the material layer until the sacrificial layer 107 has a desired height. In this case, the height of the sacrificial layer 107 may be equal to the height of the uppermost parts of the openings H' shown in FIG. 8. In addition, the sacrificial layer 107 may be formed with a material layer, e.g. an oxide layer or a nitride layer, which has an etch rate different from that of the substrate 100.

Referring to FIG. 9B, a first insulating layer pattern 110' is formed on both sidewalls of the line patterns 100A exposed by the sacrificial layer 107. The first insulating layer pattern 110' may be performed in various manners. For example, an insulating material is formed on the entire surface of the resultant structure of FIG. 9B, and then the entire surface of the insulating material is etched until the sacrificial layer 107 is exposed. During this process, the insulating material on the upper surfaces of the line patterns 100A may be removed or left. The first insulating layer pattern 110' may be formed with a material which has an etch rate different from that of the sacrificial layer 107. For example, the first insulating layer pattern 110' may be a nitride layer when the sacrificial layer 107 is an oxide layer, or the first insulating layer pattern 110' may be an oxide layer when the sacrificial layer 107 is a nitride layer.

Subsequently, the sacrificial layer 107 exposed by the first insulating layer pattern 110' is removed. The removal of the sacrificial layer 107 may be performed in a wet-etching or dry-etching way.

Upon completing the above process, the insulating layer patterns 100' and openings H' can be formed as shown in FIG. 8.

According to the electronic devices or appliances and the method for fabricating the same in accordance with the aforementioned technology, the higher degree of integration of a device can be realized, the switching characteristics can be improved, and the degree of difficulty of the process can be reduced.

The above and other memory circuits or semiconductor devices based on the disclosed technology can be used in a range of devices or systems. FIGS. 10-14 provide some examples of devices or systems that can implement the memory circuits disclosed herein.

Figure 10:
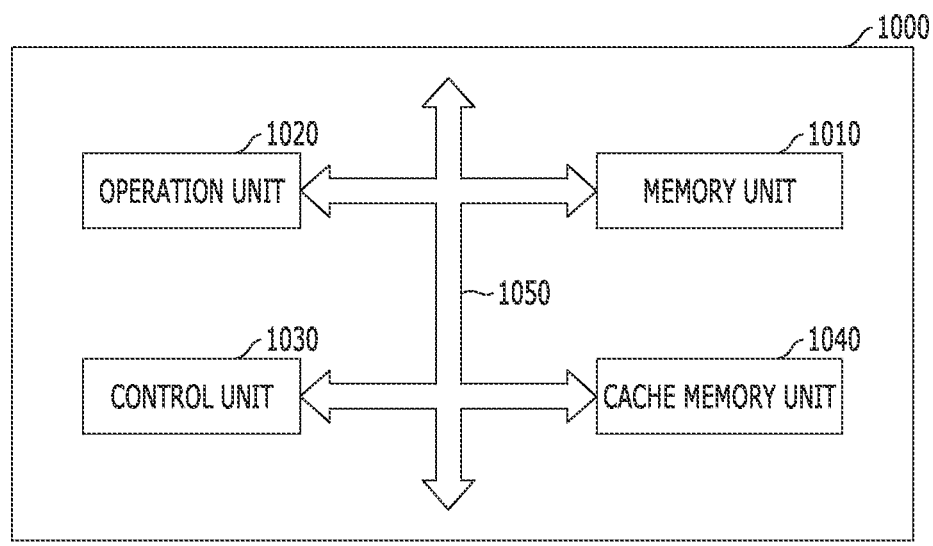
FIG. 10 is an example of configuration diagram of a microprocessor implementing memory circuitry based on the disclosed technology.

FIG. 10 is an example of configuration diagram of a microprocessor implementing memory circuitry based on the disclosed technology.

Referring to FIG. 10, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing the operations are stored.

The memory unit 1010 may include one or more of the above-described semiconductor devices in accordance with the implementations. For example, the memory unit 1010 may include a substrate configured to comprise a plurality of line patterns which are extended in a second direction, and a plurality of pillar patterns which protrude perpendicular to the line patterns and are arranged in the second direction and in a first direction crossing the second direction; a source line configured to be formed between the line patterns, to be coupled to the line patterns disposed at both sides of the source line, and to be extended in the second direction; a word line configured to be in contact with sidewalls of the pillar patterns arranged in the first direction, and to be extended in the first direction; an interconnection line configured to be disposed over the pillar patterns, and to be extended in the first direction so as to be coupled to the pillar patterns arranged in the first direction; variable resistance elements configured to be disposed over the interconnection line, and to be positioned between the pillar patterns which are adjacent to each other in the first direction; and a bit line configured to be disposed over the variable resistance elements, and to be extended in the second direction so as to be coupled to the variable resistance elements arranged in the second direction. Through this, in the memory unit 1010 and the microprocessor 1000, the higher degree of integration can be realized, the switching characteristics can be improved, and the degree of difficulty of the process can be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 11:
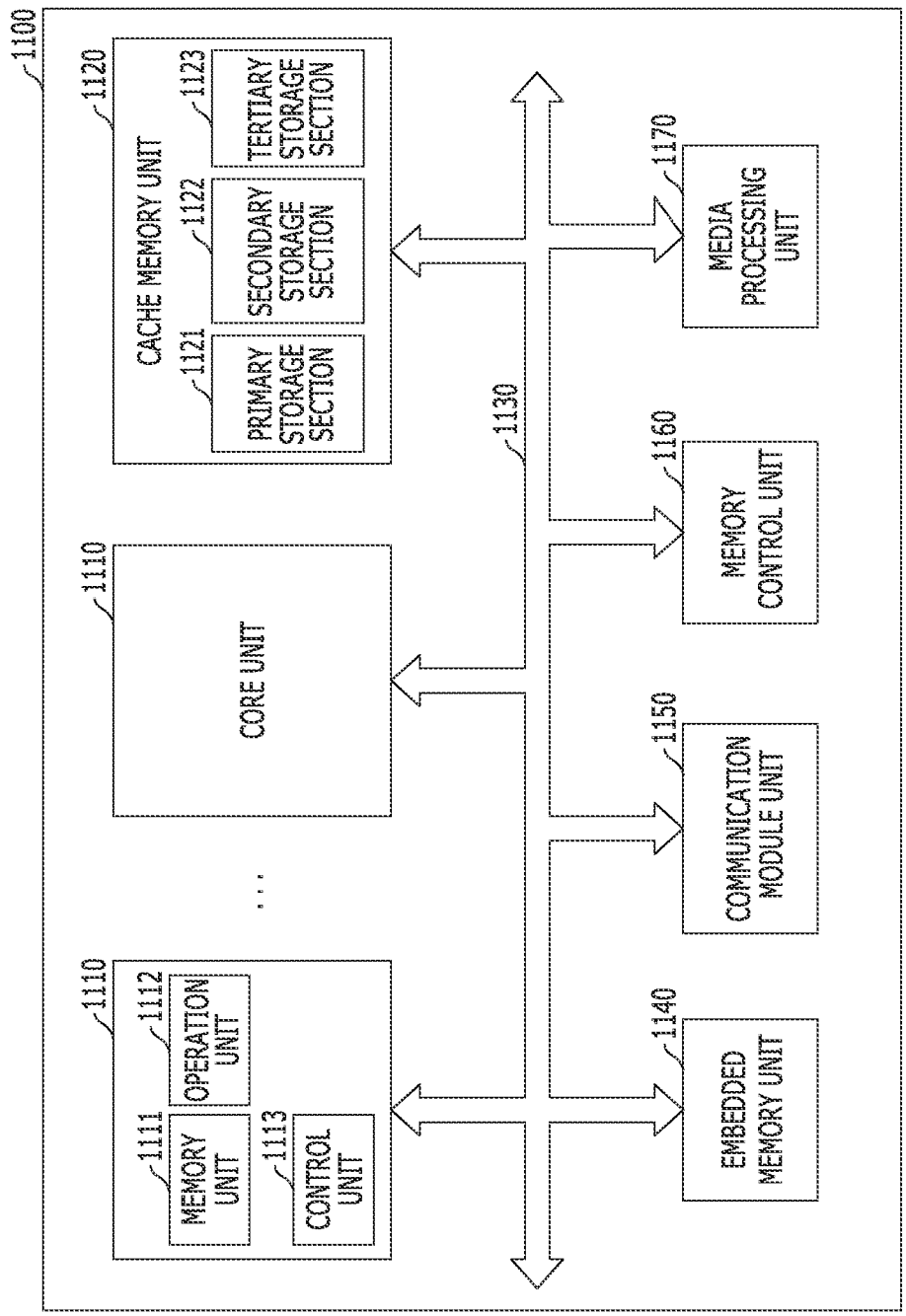
FIG. 11 is an example of configuration diagram of a processor implementing memory circuitry based on the disclosed technology.

FIG. 11 is an example of configuration diagram of a processor implementing memory circuitry based on the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate configured to comprise a plurality of line patterns which are extended in a second direction, and a plurality of pillar patterns which protrude perpendicular to the line patterns and are arranged in the second direction and in a first direction crossing the second direction; a source line configured to be formed between the line patterns, to be coupled to the line patterns disposed at both sides of the source line, and to be extended in the second direction; a word line configured to be in contact with sidewalls of the pillar patterns arranged in the first direction, and to be extended in the first direction; an interconnection line configured to be disposed over the pillar patterns, and to be extended in the first direction so as to be coupled to the pillar patterns arranged in the first direction; variable resistance elements configured to be disposed over the interconnection line, and to be positioned between the pillar patterns which are adjacent to each other in the first direction; and a bit line configured to be disposed over the variable resistance elements, and to be extended in the second direction so as to be coupled to the variable resistance elements arranged in the second direction. Through this, in the cache memory unit 1120 and the processor 1100, the higher degree of integration can be realized, the switching characteristics can be improved, and the degree of difficulty of the process can be reduced.

Although it was shown in FIG. 11 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 12:
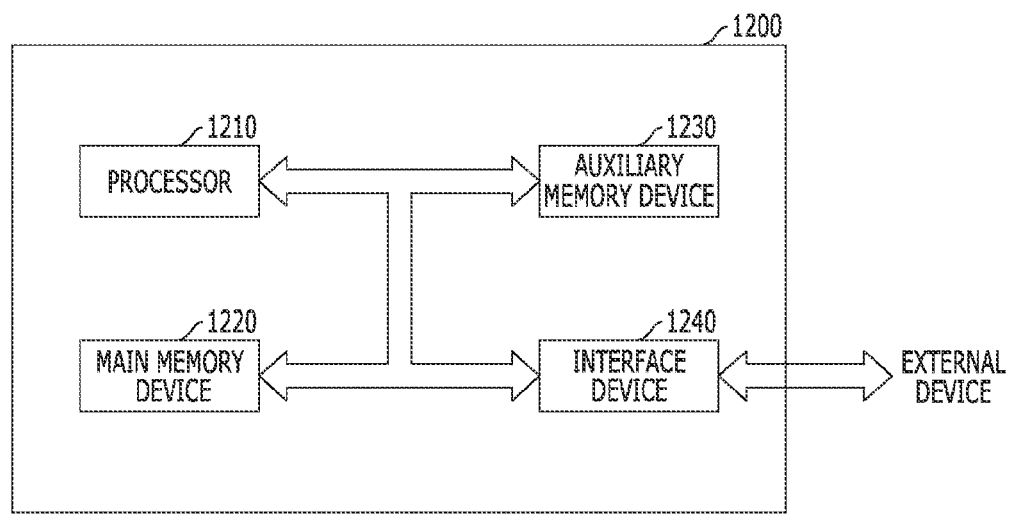
FIG. 12 is an example of configuration diagram of a system implementing memory circuitry based on the disclosed technology.

FIG. 12 is an example of configuration diagram of a system implementing memory circuitry based on the disclosed technology.

Referring to FIG. 12, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate configured to comprise a plurality of line patterns which are extended in a second direction, and a plurality of pillar patterns which protrude perpendicular to the line patterns and are arranged in the second direction and in a first direction crossing the second direction; a source line configured to be formed between the line patterns, to be coupled to the line patterns disposed at both sides of the source line, and to be extended in the second direction; a word line configured to be in contact with sidewalls of the pillar patterns arranged in the first direction, and to be extended in the first direction; an interconnection line configured to be disposed over the pillar patterns, and to be extended in the first direction so as to be coupled to the pillar patterns arranged in the first direction; variable resistance elements configured to be disposed over the interconnection line, and to be positioned between the pillar patterns which are adjacent to each other in the first direction; and a bit line configured to be disposed over the variable resistance elements, and to be extended in the second direction so as to be coupled to the variable resistance elements arranged in the second direction. Through this, in the main memory device 1220 and the system 1200, the higher degree of integration can be realized, the switching characteristics can be improved, and the degree of difficulty of the process can be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate configured to comprise a plurality of line patterns which are extended in a second direction, and a plurality of pillar patterns which protrude perpendicular to the line patterns and are arranged in the second direction and in a first direction crossing the second direction; a source line configured to be formed between the line patterns, to be coupled to the line patterns disposed at both sides of the source line, and to be extended in the second direction; a word line configured to be in contact with sidewalls of the pillar patterns arranged in the first direction, and to be extended in the first direction; an interconnection line configured to be disposed over the pillar patterns, and to be extended in the first direction so as to be coupled to the pillar patterns arranged in the first direction; variable resistance elements configured to be disposed over the interconnection line, and to be positioned between the pillar patterns which are adjacent to each other in the first direction; and a bit line configured to be disposed over the variable resistance elements, and to be extended in the second direction so as to be coupled to the variable resistance elements arranged in the second direction. Through this, in the auxiliary memory device 1230 and the system 1200, the higher degree of integration can be realized, the characteristics can be improved, and the degree of difficulty of the process can be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 13:
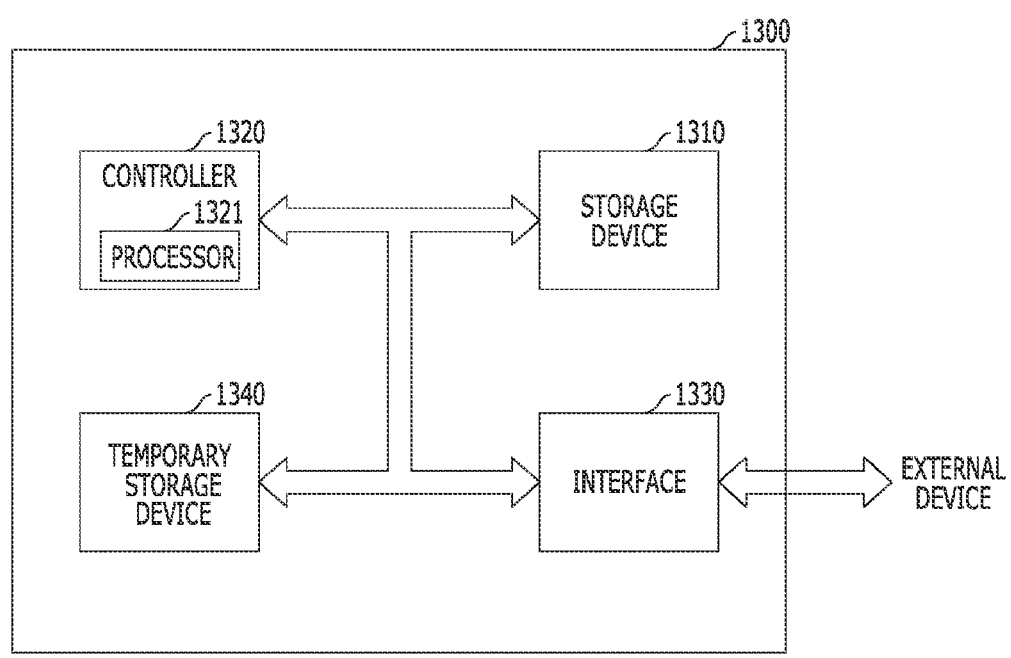
FIG. 13 is an example of configuration diagram of a data storage system implementing memory circuitry based on the disclosed technology.

FIG. 13 is an example of configuration diagram of a data storage system implementing memory circuitry based on the disclosed technology.

Referring to FIG. 13, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate configured to comprise a plurality of line patterns which are extended in a second direction, and a plurality of pillar patterns which protrude perpendicular to the line patterns and are arranged in the second direction and in a first direction crossing the second direction; a source line configured to be formed between the line patterns, to be coupled to the line patterns disposed at both sides of the source line, and to be extended in the second direction; a word line configured to be in contact with sidewalls of the pillar patterns arranged in the first direction, and to be extended in the first direction; an interconnection line configured to be disposed over the pillar patterns, and to be extended in the first direction so as to be coupled to the pillar patterns arranged in the first direction; variable resistance elements configured to be disposed over the interconnection line, and to be positioned between the pillar patterns which are adjacent to each other in the first direction; and a bit line configured to be disposed over the variable resistance elements, and to be extended in the second direction so as to be coupled to the variable resistance elements arranged in the second direction. Through this, in the storage device 1310 or the temporary storage device 1340, the higher degree of integration can be realized, the switching characteristics can be improved, and the degree of difficulty of the process can be reduced.

Figure 14:
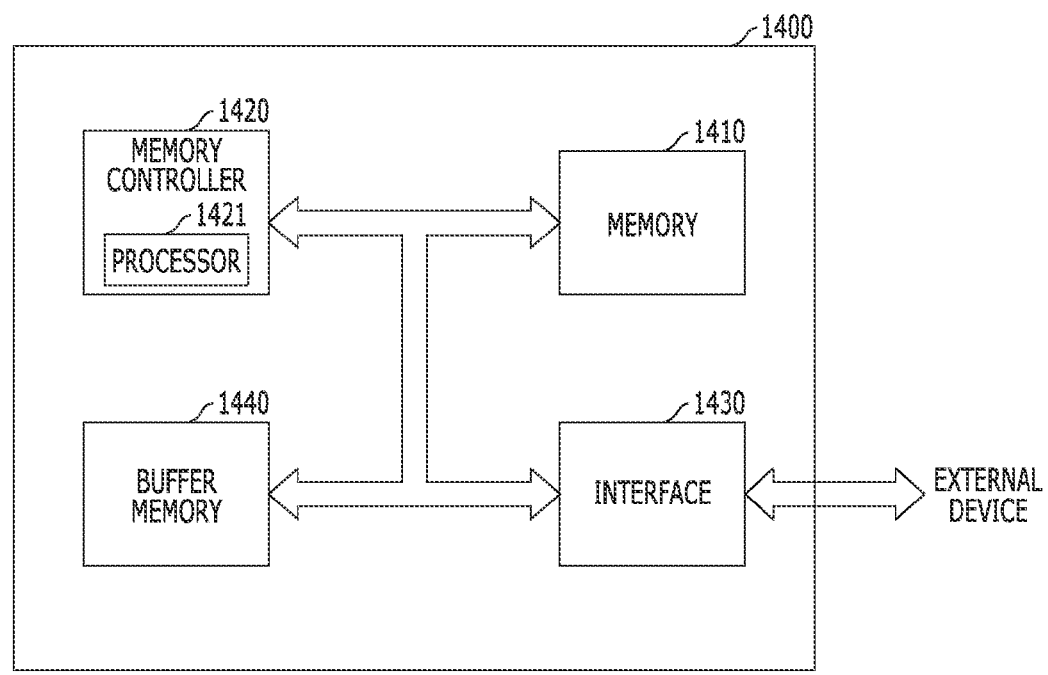
FIG. 14 is an example of configuration diagram of a memory system implementing memory circuitry based on the disclosed technology.

FIG. 14 is an example of configuration diagram of a memory system implementing memory circuitry based on the disclosed technology.

Referring to FIG. 14, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate configured to comprise a plurality of line patterns which are extended in a second direction, and a plurality of pillar patterns which protrude perpendicular to the line patterns and are arranged in the second direction and in a first direction crossing the second direction; a source line configured to be formed between the line patterns, to be coupled to the line patterns disposed at both sides of the source line, and to be extended in the second direction; a word line configured to be in contact with sidewalls of the pillar patterns arranged in the first direction, and to be extended in the first direction; an interconnection line configured to be disposed over the pillar patterns, and to be extended in the first direction so as to be coupled to the pillar patterns arranged in the first direction; variable resistance elements configured to be disposed over the interconnection line, and to be positioned between the pillar patterns which are adjacent to each other in the first direction; and a bit line configured to be disposed over the variable resistance elements, and to be extended in the second direction so as to be coupled to the variable resistance elements arranged in the second direction. Through this, in the memory 1410 and the memory system 1400, the higher degree of integration can be realized, the switching characteristics can be improved, and the degree of difficulty of the process can be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate configured to comprise a plurality of line patterns which are extended in a second direction, and a plurality of pillar patterns which protrude perpendicular to the line patterns and are arranged in the second direction and in a first direction crossing the second direction; a source line configured to be formed between the line patterns, to be coupled to the line patterns disposed at both sides of the source line, and to be extended in the second direction; a word line configured to be in contact with sidewalls of the pillar patterns arranged in the first direction, and to be extended in the first direction; an interconnection line configured to be disposed over the pillar patterns, and to be extended in the first direction so as to be coupled to the pillar patterns arranged in the first direction; variable resistance elements configured to be disposed over the interconnection line, and to be positioned between the pillar patterns which are adjacent to each other in the first direction; and a bit line configured to be disposed over the variable resistance elements, and to be extended in the second direction so as to be coupled to the variable resistance elements arranged in the second direction. Through this, in the buffer memory 1440 and the memory system 1400, the higher degree of integration can be realized, the switching characteristics can be improved, and the degree of difficulty of the process can be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 10-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory which includes:
    a substrate extending along first and second directions and including a plurality of line patterns extending in the second direction, and a plurality of pillar patterns protruding from the line patterns and arranged in a matrix along the first and second directions;
    a source line extending in the second direction and formed between the line patterns to be coupled to the line patterns;
    a word line extending in the first direction and in contact with sidewalls of the pillar patterns arranged in the first direction;
    an interconnection line formed over pillar patterns of the plurality of pillar patterns, which are arranged in the first direction, and extending in the first direction so as to be coupled to the said pillar patterns of the plurality of pillar patterns;
    variable resistance elements formed over the interconnection line and positioned between the pillar patterns which are adjacent to each other in the first direction; and
    a bit line formed over the variable resistance elements and extending in the second direction so as to be coupled to the variable resistance elements arranged in the second direction.

2. The electronic device of claim 1, further comprising:
    a first insulating layer pattern having openings to expose parts of both sidewalls of the line patterns,
    wherein the source line is coupled to the line patterns through the openings.

3. The electronic device of claim 1, further comprising:
    a first insulating layer pattern including openings to expose parts of both sidewalls of the line patterns and the substrate positioned between the adjacent line patterns arranged in the first direction,
    wherein the source line is coupled to the line patterns through the openings.

4. The electronic device of claim 1, wherein a lower surface of the word line is positioned over an upper surface of the source line, and an upper surface of the word line is positioned below upper surfaces of the pillar patterns.

5. The electronic device of claim 1, wherein the variable resistance elements include a metal oxide, a phase change material, a ferroelectric material or a ferromagnetic material.

6. The electronic device of claim 1, wherein one of the pillar patterns and the word line in contact with the pillar pattern form one transistor, and each of the variable resistance elements is driven by two transistors positioned at both sides of the variable resistance element and arranged adjacently in the first direction.

7. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

8. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

9. The electronic device according to claim 1, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside,
- wherein the semiconductor memory is part of the storage device or the temporary storage device in the data storage system.

10. An electronic device which comprises a semiconductor memory, the semiconductor memory comprising:
- a plurality of pairs of a word line and an interconnection line extending in a first direction;
- a plurality of pairs of a source line and a bit line extending in a second direction crossing the first direction;
- transistors disposed in regions wherein the word lines, interconnection lines and the source lines overlap, each transistor having three terminals coupled to a corresponding source line, a corresponding interconnection line, and a corresponding word line, respectively; and
- variable resistance elements disposed in regions in which the bit lines and corresponding interconnection lines overlap, each variable resistance element being configured to have one terminal coupled to a corresponding interconnection line and another terminal coupled to a corresponding bit line.

11. The electronic device of claim 10, wherein each variable resistance element is driven by two transistors positioned at both sides of the variable resistance element in the first direction.

12. An electronic device which comprises a semiconductor memory, the semiconductor memory comprising:
- a substrate including a plurality of line patterns arranged in a first direction and a plurality of pillar patterns arranged in a first direction, the plurality of line patterns protruding from the substrate and having openings formed on both sidewalls of the respective line patterns, and the plurality of pillar patterns being positioned above the plurality of line patterns;
- a source line being formed between the adjacent line patterns arranged in the first direction and being in contact with the openings;
- a word line being formed on both sidewalls of each pillar pattern;
- an interconnection line being coupled to the pillar patterns arranged in the first direction and having a variable resistance element formed thereon, the variable resistance element being in contact with a bit line positioned above the pillar patterns.

13. The electronic device of claim 12, wherein the upper surfaces of the source lines are positioned at the same or greater height than the upper surfaces of the corresponding openings.

14. The electronic device of claim 12, wherein the bottom surfaces of the word lines are positioned to be higher than the source lines and the height of the top surfaces of the word lines are positioned to be lower than the height of the top surfaces of the pillar patterns.

15. The electronic device of claim 12, wherein the plurality of line pattern have openings on the substrate between the adjacent line patterns arranged in the first direction in addition to the openings formed on both sidewalls of the respective line patterns.

16. The electronic device of claim 12, the word lines formed on the pillar patterns intersect with the source lines formed on the line patterns positioned below the pillar patterns.

* * * * *